US008752272B2

(12) United States Patent
Hartmann et al.

(10) Patent No.: US 8,752,272 B2
(45) Date of Patent: Jun. 17, 2014

(54) METHOD FOR MOLDING A PLUG AND A HOSE OR A PIPE

(75) Inventors: Harald Hartmann, Dornbirn (AT); Werner Bachmann, Hard (AT)

(73) Assignee: Henn GmbH & Co. KG, Dornbirn (AT)

( * ) Notice: Subject to any disclaimer, the term of this patent is extended or adjusted under 35 U.S.C. 154(b) by 72 days.

(21) Appl. No.: 12/899,669

(22) Filed: Oct. 7, 2010

(65) Prior Publication Data

US 2011/0057344 A1 Mar. 10, 2011

Related U.S. Application Data

(62) Division of application No. 11/530,248, filed on Sep. 8, 2006, now Pat. No. 7,975,373.

(30) Foreign Application Priority Data

Sep. 10, 2005 (DE) ......................... 10 2005 043 140

(51) Int. Cl.
*G01R 31/28* (2006.01)

(52) U.S. Cl.
USPC ............. 29/593; 29/592.1; 29/888.3; 29/428; 29/729

(58) Field of Classification Search
USPC .............. 29/402.02, 712, 721, 729, 787, 795; 264/40.1, 272.11, 320; 285/256, 321, 285/344; 425/393
See application file for complete search history.

(56) References Cited

U.S. PATENT DOCUMENTS 5,855,399 A 1/1999 Profunser
6,131,959 A * 10/2000 Profunser ..................... 285/256
7,387,318 B2 * 6/2008 Yoshida ........................ 285/321
7,614,665 B2 * 11/2009 Hartmann ...................... 285/321
2008/0191481 A1 * 8/2008 Hartmann ...................... 285/344

FOREIGN PATENT DOCUMENTS

| | | |
|---|---|---|
| DE | 26 13 240 | 10/1977 |
| DE | 40 05 826 | 8/1991 |
| DE | 195 22 690 | 1/1997 |
| DE | 298 20 718 | 3/1999 |
| EP | 0 637 473 | 2/1995 |
| NL | 8300123 | 8/1984 |
| WO | 2005/047751 | 3/2005 |
| WO | 2005/046906 | 5/2005 |

OTHER PUBLICATIONS

Search Report for corresponding European Patent Application No. 06 01 6767, dated Dec. 27, 2006.

Statement of EPO regarding European Search Report of corresponding Application No. EP 06 01 6767, dated Jan. 24, 2007.

* cited by examiner

*Primary Examiner* — Paul D Kim
(74) *Attorney, Agent, or Firm* — Faegre Baker Daniels LLP

(57) ABSTRACT

A method for molding a plug and a hose or a pipe, wherein the plug is part of a pipe connection and the pipe connection is constructed as a sealing plug-in connection between a connecting piece and the plug. The plug includes an outer part and an inner part connected to each other in one piece and a rear free end of the plug forms an annular gap. The deformation forces acting on expanding jaws of an expanding device during the molding of the plug and the hose or the pipe are directly recorded and the molding of the plug and the hose or the pipe is performed in dependency on these directly recorded deformation forces. As a result, a constant molding degree is achieved in case of plugs and hoses or pipes with varying wall thicknesses.

6 Claims, 7 Drawing Sheets

METHOD FOR MOLDING A PLUG AND A HOSE OR A PIPE

CROSS-REFERENCE TO RELATED APPLICATION

Figure 1:
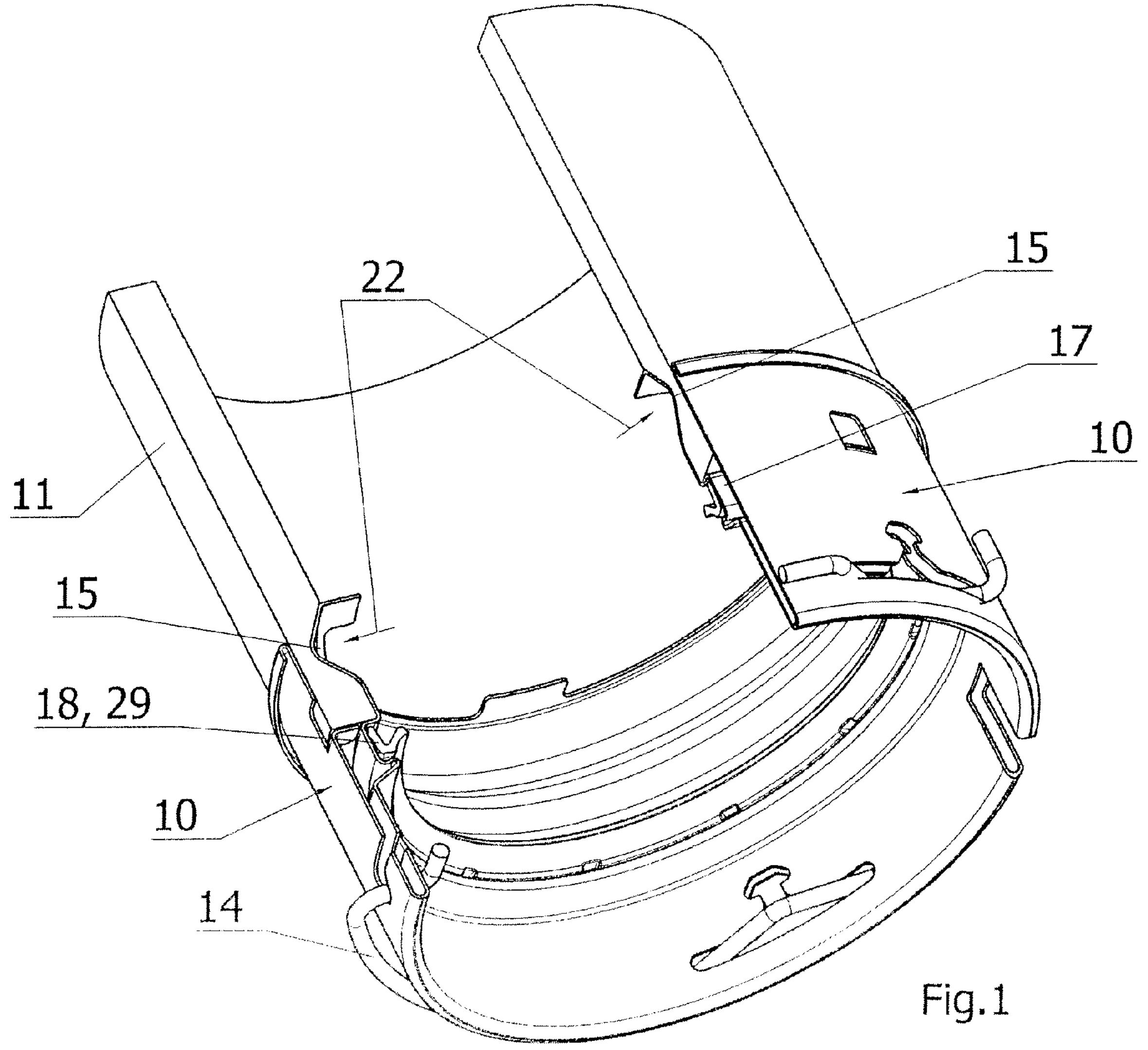

This application is a Division of patent application Ser. No. 11/530,248, filed Sep. 8, 2006, now U.S. Pat. No. 7,975,373, the disclosure of which is hereby explicitly incorporated by reference herein.

The object of the invention is a method in accordance with claim 1.

There are a number of publications going back to the same applicant in which the function of a plug-in connection is described as part of a sealing pipe connection.

Reference is made to PCT/EP2004/001886 only as an example, in which the function of such a plug-in connection is described.

The same applies for U.S. Pat. No. 5,855,399 or PCT/WO2005/047751 A1.

The object of the pipe connections is to produce a sealing plug-in connection between a plug and a connecting piece.

In the case of such plug-in connections the connection of a hose to be joined to the plug is problematic. In the previously described publications provision is made for the plug to form an annular mounting area into which the front end of the hose engages, wherein the inner part of the plug is formed with an expanding tool placed on the inside wall of the plug in such a way that a rotary molding slot directed radially outward results which presses the hose together on the total periphery in diameter lessening manner in the annular gap of the plug. In this way the hose is firmly held in a sealing manner in the annulus of the plug by the named mold connection.

However, difficulties have arisen in the production of this molding slot. The problem in this connection is that the hose does not always exhibit a constant diameter and in particular the wall thickness also varies.

If one always formed the molding slot with the same depth, then it can happen that the connection is not seated sufficiently securely in the case of hoses with slight wall thickness. The density of this connection can also be impaired.

The invention is thus based on the object of further developing a method and a device for the molding of elastomer hoses in plugs as part of a pipe connection in such a way that a secure and operable molding connection is produced between the plug and the elastomer hose, said molding connection being independent of wall thicknesses of the plug, the hose and the like.

The term "hose" is interpreted broadly within the scope of the present invention. Not just an elastomer hose is understood, but rather also a pipe which also does not necessarily have to be an elastomer. It can also be conventional plastic pipes in which it is also possible on the basis of the material properties to form the material in such a way that a seam directed radially outwards in the inner part of the plug engages in the material of the pipe.

For the solution of the problem the invention is characterized by the fact that a molding slot is formed in the material of the plug with an expanding tool acting in radial direction, said molding slot engaging in the material of the pipe or hose and by the fact that a sensor subjected to radial deformations is arranged at least at one place of the expanding jaw, said sensor recording the radial resiliency of the expanding work and therewith regulating the expanding drive.

With the given technical teaching a completely new method is described which is geared toward a direct recording of the deformation forces in the molding of hoses, pipes and the like.

With this a direct measuring system for an automatic assembly machine for the production of the mentioned molding is realized, wherein with this simultaneously a tool breakage monitoring of the expanding tool is also given.

A monitoring of the screw tightening torque of fastening screws is also given with the technical teaching of the invention, said fastening screws constituting the connection between the actual expanding tool and the diagonal sliders expanding shoulder to be placed on the expanding tool.

One significant advantage of a further development of the invention lies in the fact that the molding slot is arranged directed from the inner circumference of the plug to the outside. With this the advantage results that the expanding forces can be measured directed from radial inside to radial outside, which is a significant advantage compared to the state of the art, in which the expanding forces can only be recorded in the radial exterior region of the plug (indirectly).

The technical teaching of the invention also results in the advantage that the formation of cracks is avoided in the molding operation, as a result of which the molding connection produced in this way is free from cracks and therefore works reliably.

Slight wall thickness differences both in the hose as well as in the plug can be detected and compensated with the inventive method.

In the case of known systems the forming pressure is only recorded via the measurement of the path or of the pressure, however not via a measurement of force. With this wall thickness variations of the materials (plug and pipe or hose) cannot be monitored precisely enough. It is also known to record the forces indirectly on the outer diameter of the plug, which however is susceptible to trouble because only an indirect measurement takes place and as a result of this the measuring accuracy is impaired.

Therefore the following items represent the advantage of the invention:

- Direct measurement of the occurring deformation force in the smallest space
- Monitoring of tool breakage
- Monitoring of the tightening torque of the tool fastening screws
- Breakage monitoring of the tool fastening screws
- Detection and monitoring of slight wall thickness differences of the hose, the pipe and the plug part
- Crack detection of the plug parts, pipes and hoses
- Tolerance minimization with regard to concentricity
- Cost effective, less susceptible to trouble
- Extreme bends of hose, pipe, . . . are possible since the holding fixture is made from the inside Thus with the invention a path-dependent power control system of the molding between hose, pipe and similar media and a deformable plug is realized which regardless of the wall thicknesses of the hose, the pipe, the plug is always formed to the desired, set degree dependent on the wall thickness.

In a preferred embodiment the plug therefore consists of a deformable metal material, such as for example sheet steel, an aluminum material, high-grade steel and similar other deformable solid materials.

By means of the optimization of the molding function the desired degree of deformation (variable) is always achieved regardless of the wall thickness.

Here, in accordance with the invention at least one sensor, preferably however several sensors, is used, said sensors being integrated in the so-called diagonal sliders, said diagonal sliders being connected to an expanding jaw with their front free ends. The expanding jaws engage in the interior of the plug to be deformed and realize the molding slot at the inner surface of the plug (directed radially outward) with an expanding shoulder correspondingly directed radially outward.

In this connection it is preferred if the sensors measuring the deformation forces are arranged in the diagonal sliders.

However, in another design of the invention provision can be made that these sensors are integrated directly in the expanding jaws themselves.

The expanding mechanism for radially outward expansion of the expanding jaws opposing each other can be altered in other respects in broad bounds. In a first preferred embodiment of the invention the expanding mechanism consists essentially of a rotary driven spindle, on which a spindle slot shifts, said spindle slot converting its axial motion into a corresponding radial expanding movement of the expanding jaws. To this purpose a tapered slide valve is fastened to the spindle slot and the tapered slide valve also executes an axial movement with the spindle slot, said axial movement acting on a diagonal slider which is forced into a radial movement and which therefore drives the expanding jaws in radial direction.

Other expanding devices can also be used in place of this drive principle using a spindle, spindle slot, tapered slide valve and diagonal slider.

In a second embodiment of the invention provision is thus made that the aforementioned tapered slide valve is part of a pipe which is shifted as a whole and thus carries the aforementioned diagonal slider along, said diagonal slider then executing the aforementioned expanding movement in the same manner. With this it has been clarified that the drive principle for the expanding device can be varied in different ways.

The subject matter of the present invention results not only from the subject matter of the individual patent claims, but rather also from the combination of the individual patent claims with each other.

All information and features disclosed in the documents, including the abstract, in particular the spatial development represented in the drawings, are claimed as essential to the invention provided they are new in comparison to the state of the art, either individually or in combination.

In the following the invention is described more closely with the help of drawings depicting only one embodiment. In this connection further features that are essential to the invention and advantages of the invention arise from the drawings and their description.

Figure 2:
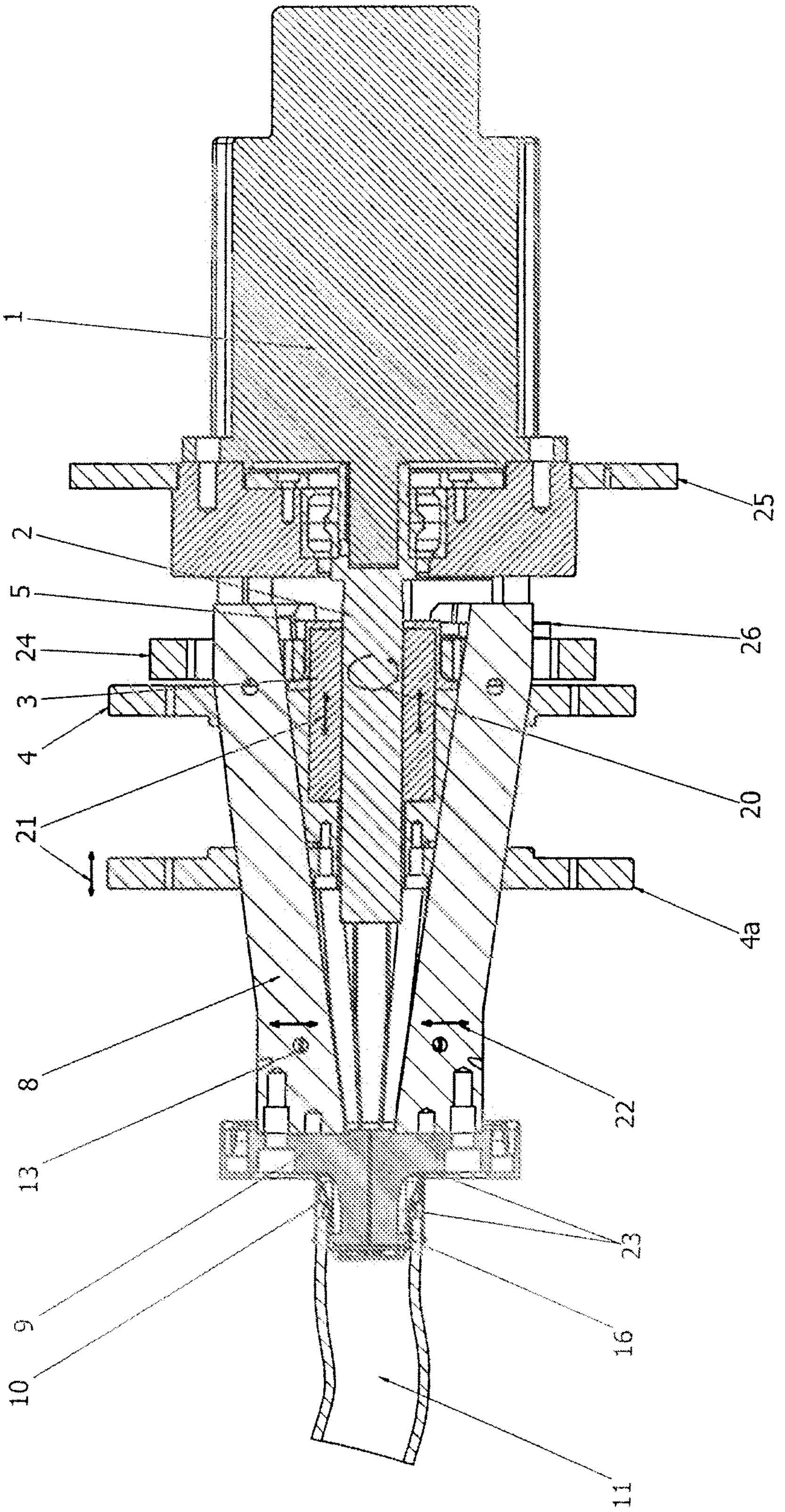
Figure 3:
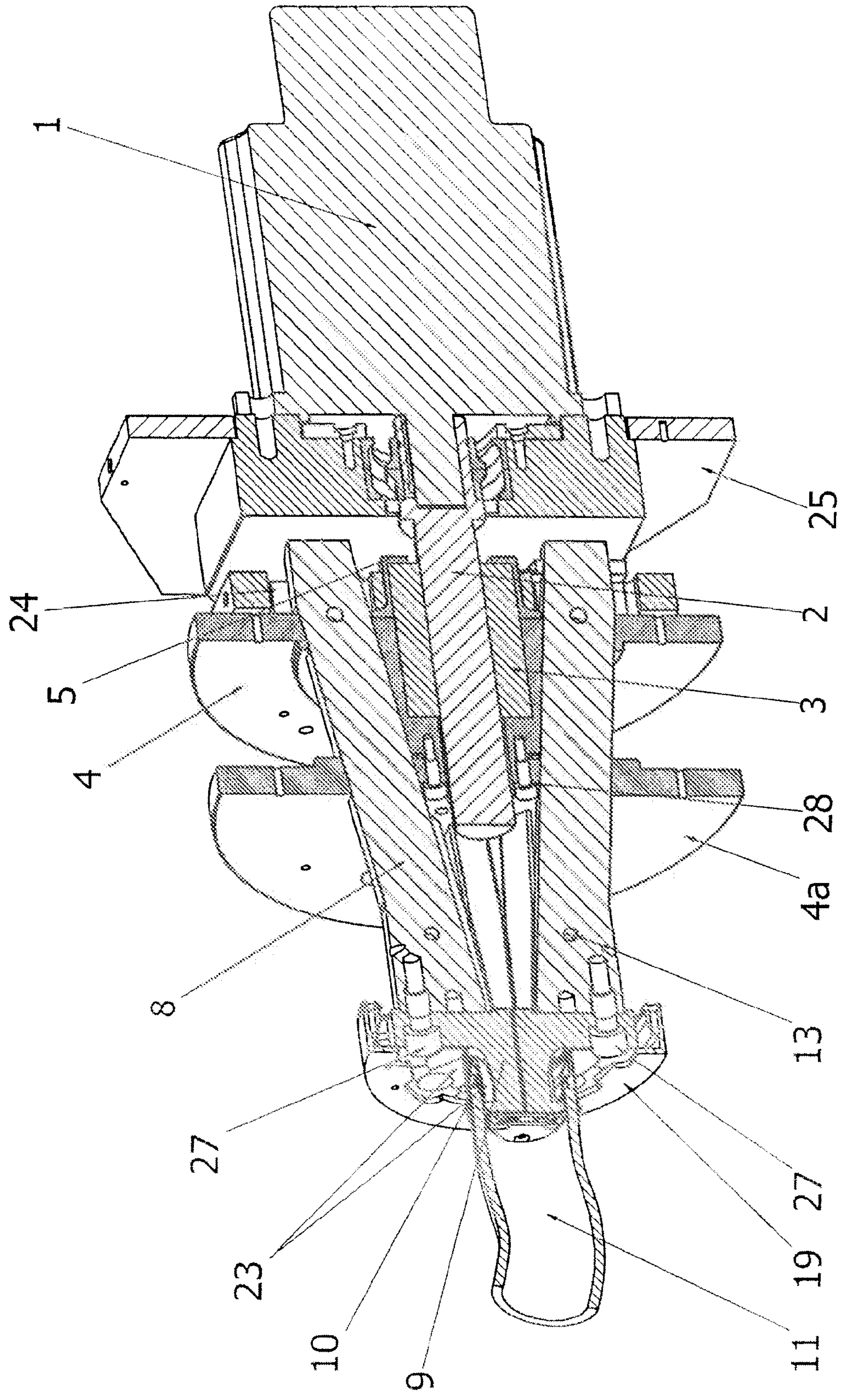
Figure 4:
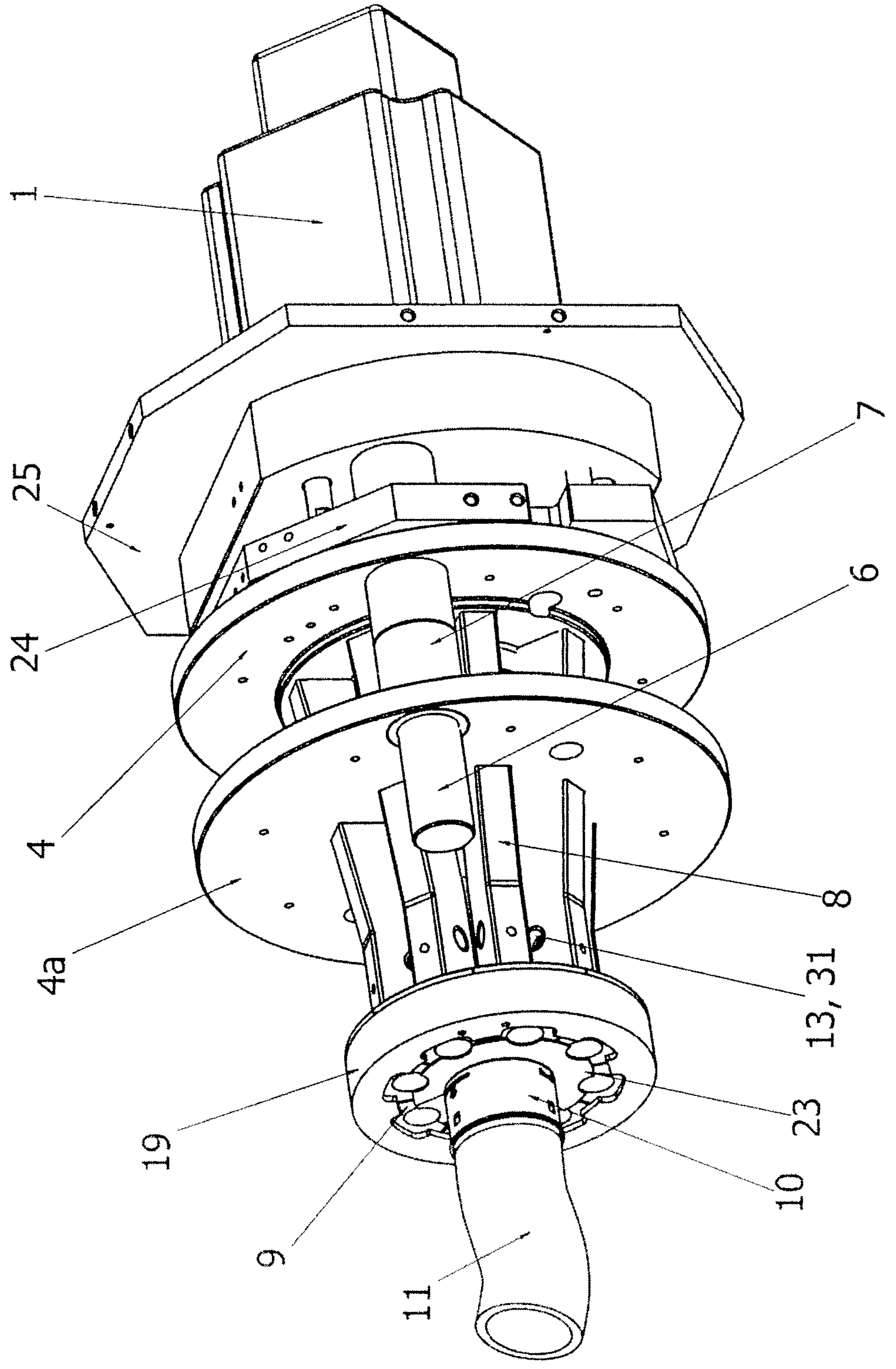
Figure 5:
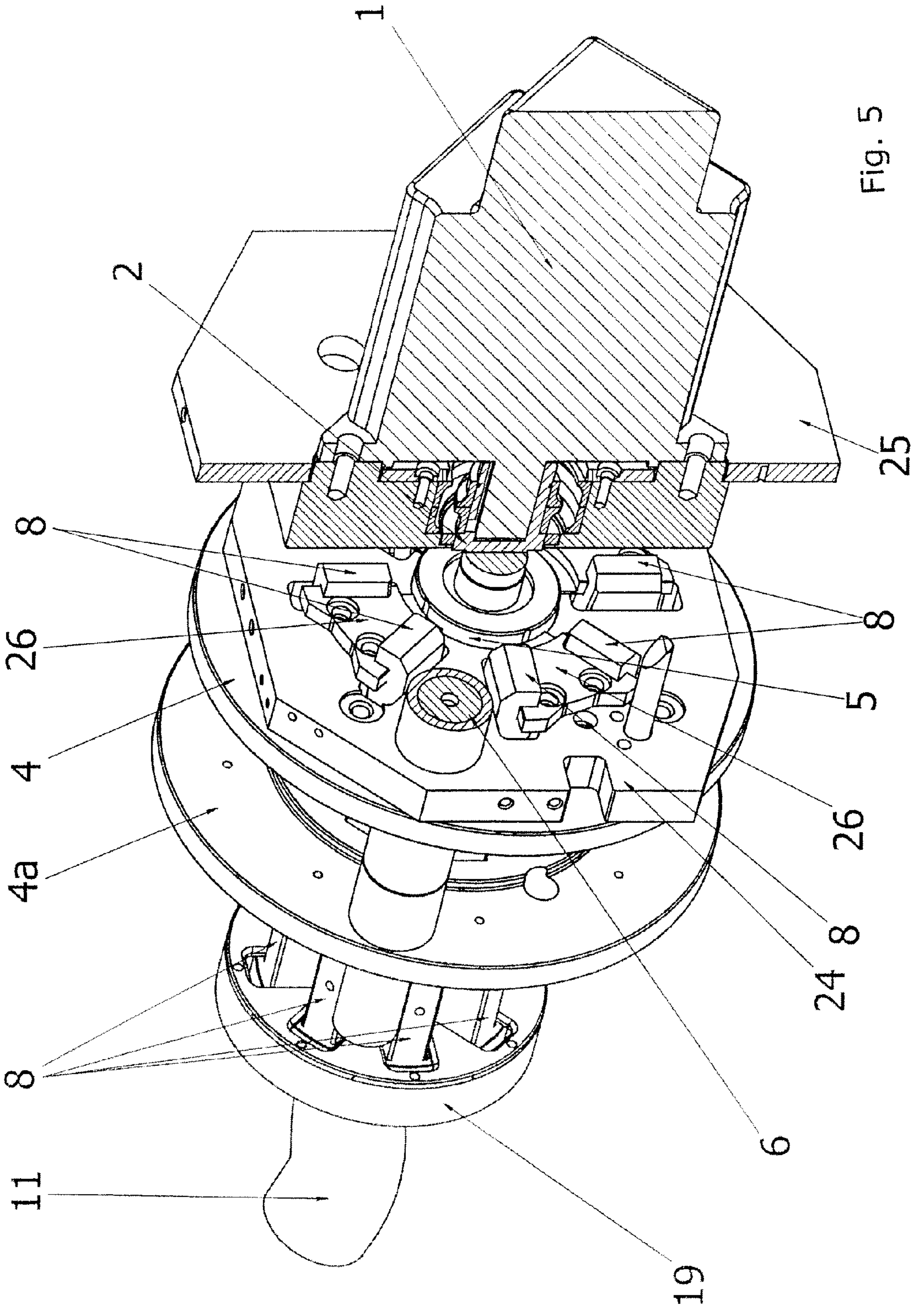
Figure 7:
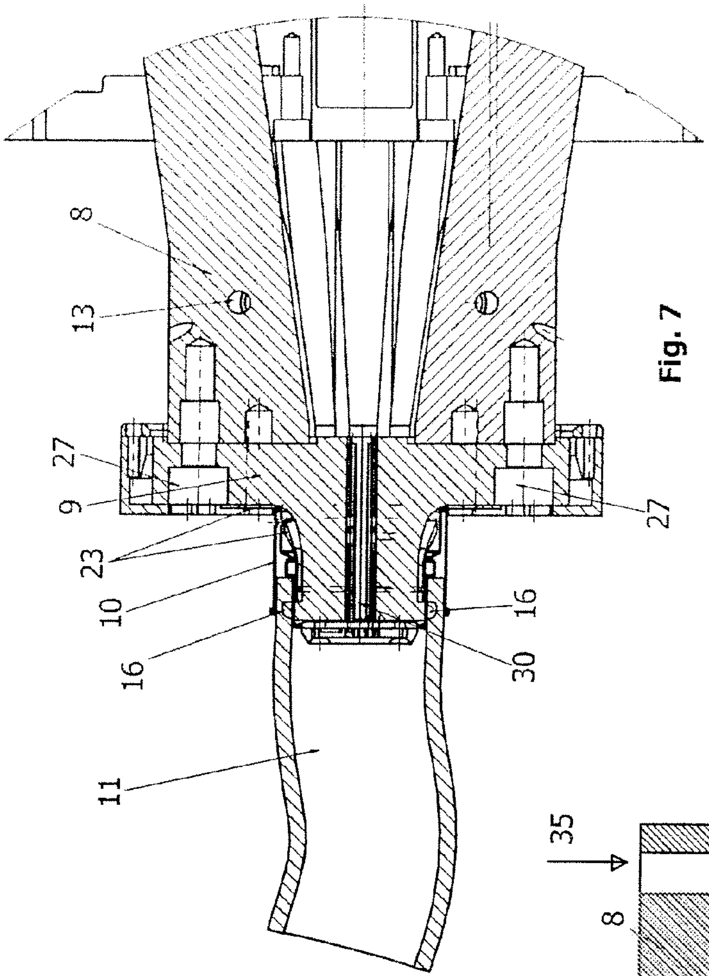
Figure 8:
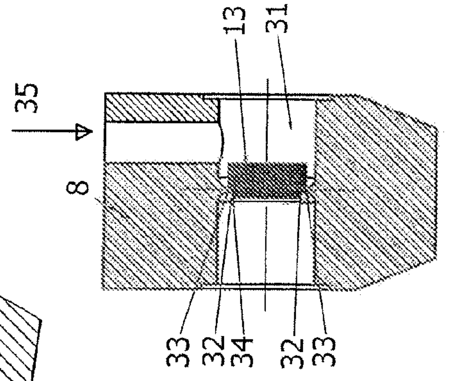
Figure 6:
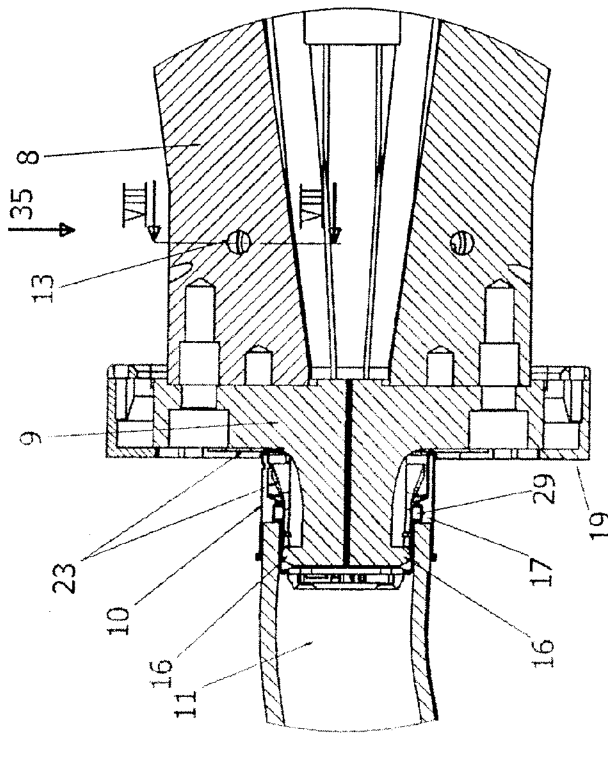
Figure 9:
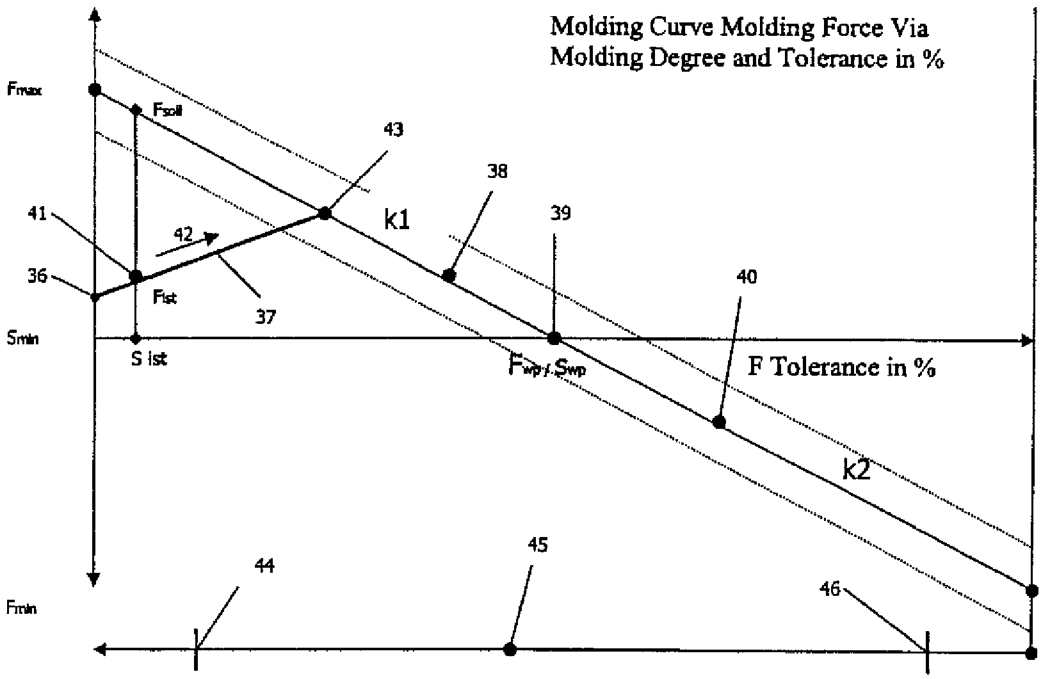

The figures show the following:

FIG. 1: schematic in perspective view the representation of a plug with a hose attached through a molding slot;

FIG. 2: a section through an expanding device according to the invention;

FIG. 3: a perspective, partially cut representation of the device according to FIG. 2;

FIG. 4: the perspective representation of the expanding device in lateral view;

FIG. 5: a further partial section through the rear region of the expanding device in perspective representation;

FIG. 6: the cut representation of the expanding tools in non-operative state;

FIG. 7: the expanding tool in the execution of the expanding operation;

FIG. 8: an enlarged sectional representation through the fastening of a sensor in the diagonal slider;

FIG. 9: a schematic representation of the path-dependent power control system.

FIG. 1 shows that a plug 10 preferably made of a metal material forms an annular gap 17, into which the front end of a hose 11 is inserted and is secured there with a molding slot 15 directed from inside to outside.

The plug 10 consists of an inner part and an outer part, said parts together forming the annular gap 17 on the free rear end. The inner and outer parts are connected to each other in one piece.

Of course provision can also be made that both parts (inner and outer parts) are joined to each other by flanging or another manner of fastening.

For the sake of completion it is also represented that a holding fixture 29 for a sealing washer 18 connects to the annular gap 17, which then results in the sealing pipe connection with a support not shown in greater detail. The support is then inserted into the interior of the plug 10 and fastened there.

The fastening takes place with a stop spring 14, so that this plug-in connection is constructed to engage and disengage easily.

In the following an expanding device and a method for operation of the expanding device will be explained with which the molding slot 15 placed in the direction of the arrow 22 is produced.

FIGS. 2 through 7 show the same parts of the device in various representations. The same reference characters were used for the same parts so that—even if certain reference characters are not specified—the same parts are always in the same place in the drawings.

The rotational movement 20 generated by an electric motor 1 is transformed into an axial movement by a ball screw helical gear consisting of a spindle 2 and a spindle slot 3. The tapered slide valve 4 is fixed to the spindle slot 3 via the slot fastening 5. By means of this fixing and by means of a key slot connection between spindle 2 and tapered slide valve 4 the tapered slide valve 4 also executes an axial movement, since it can only execute axial movement 21 through the guide pillars 6 and linear ball-type nipples 7. As a result of the axial movement of the tapered slide valve the diagonal sliders 8 are forced into a radial movement 22 by means of the guide window inclined by 8 degrees in the tapered slide valve 4, since they cannot perform any axial movement through the fixed radial guides 26. They also move in radial direction due to the positive connection between the diagonal slider 8 and expanding jaws 9. By means of this generated movement 22 of the expanding jaws 9 the material of the plug 10 is deformed and hence molded onto the hose 11. The sensors 13 located in the diagonal sliders 8 measure the forces transferred by the expanding jaws 9, said forces being required for the deforming of the plug.

From FIG. 2 and in particular also from FIGS. 4, 6 and 7 it can be recognized that in total 8 arranged expanding jaws 9 uniformly distributed on the periphery are present, wherein each expanding jaw 9 is connected to the front free ends of the respectively associated diagonal sliders 8 with associated fastening screws 27.

The expanding jaws 9 are held in a tool holding fixture 19, in which an axial and a radial guide 23 is present for the plug positioning of the plug 10.

The plug is plugged in on the front side of the expanding jaws 9 and locked via a slot.

The drawing does not show that in the front region of the expanding jaws 9 a guide part is present which engages in a slot of the plug 10 which is opened radially outward and with this centers the plug on the expanding jaws 9.

FIGS. 6 and 7 only show an axial stop for the rear end of the plug 10 on the expanding jaws 9.

In other respects FIGS. 2 and 5 show that a bracket plate 24 is present on which the radial guides 26 are fastened, said radial guides serving the purpose of radial guiding of the diagonal sliders 8.

FIGS. 6 and 7 show the radial expanding shoulder 16, wherein in FIG. 6 the expanding tool is in resting position and in FIG. 7 it is in operating position. It can be seen that with this the tapered slide valves 4, 4*a* are shifted in axial direction to the front to the expanding jaws 9 and in this connection simultaneously the expanding jaws 9 are displaced in radial direction outwards so that the expanding shoulder 16 on the front free ends of the expanding jaws 9 plastically deforms the material of the plug from the inner surface in the direction of the arrow 22 (see also FIG. 1) directed radially outward.

In other respects it can be seen that the entire expanding device is flange-mounted via a fastening plate 25 on the electric motor 1.

FIG. 3 additionally shows that the tapered slide valve is constructed in two parts and consists of two tapered slide valves 4, 4*a* arranged at a distance from each other, said tapered slide valves being screwed to each other via screw couplings 28.

However, the invention is not limited to this. It has already been pointed out in the general part that the tapered slide valves 4, 4*a* can also be constructed as a pipe and that this pipe can be moved in specific manner by a linear drive.

Provision is also made in another embodiment that the tapered slide valves 4, 4*a* form a one-piece continuous part.

In the production of the molding a gap 30 in accordance with FIG. 7 forms between the expanding jaws 9 which are distributed uniformly on the periphery 9.

The technical teaching that a sensor 13 is arranged in the region of the expanding tool, preferably in the region of the diagonal sliders, is important.

In this connection it is preferred that a separate sensor 13 is assigned to each diagonal slider 8.

However, provision can also be made in another embodiment that only every second or third diagonal slider 8 is equipped with a corresponding sensor.

In this connection it is important that a borehole 31 is placed in the material of the diagonal slider perpendicular to the longitudinal extension of the respective diagonal slider 8, said borehole penetrating the entire diagonal slider 8. This can be seen for example in FIG. 4.

In FIG. 8 the deformation force 35 is plotted with an arrow which acts on the exterior of the diagonal slider 8, to be precise perpendicular to the center line of the respective borehole 31 for the holding fixture of the sensor 13.

Additional details of the structure of the borehole 31 follow from FIG. 8.

It can be seen that the borehole 31 forms two opposing cross-pieces 33 in the center, between which a guide hole 34 is formed.

The button-shaped sensor 13 moves into engagement in this guide hole with its collar of decreased diameter and is positively held in the guide hole 34.

As a result of this the rotary cross-pieces 33 also act on the entire periphery on the collar of the sensor 13 and thus uniformly pick up all forces which act on the periphery in the direction of the deformation force 35.

The sensor 13 is fixed in the guide hole 34 in such a way that it has a head of an enlarged diameter and is welded to the cross-piece 33 on the cylinder of the lesser diameter in order to hold the sensor free of movement and positively locked in the guide hole 34.

With the help of FIG. 9 the control system of the measurement of force for the named automatic assembly machine will be described in greater detail. The following sequence results: By means of the coordination of a hose, pipe, . . . the parameters of the molding program are defined. For this purpose three different hose diameters are formed to the desired degree (variable). From this we obtain the three key parameters of the molding function.

$F_{max}/S_{min}$ $F_{wp}/S_{wp}$ $F_{min}/S_{max}$

The database calculates the two gradients k1 and k2 using these three parameters and passes them to the control system. The control system positions the mold to $S_{min}$, there the program tests whether $F_{ist}<F_{max}$. At this point the path-dependent power control system begins. In the process the control system has to continuously calculate $F_{soll}$ (variable curve), which changes with increasing $S_{ist}$.

The control system has to position until $F_{soll}=F_{ist}$ deceleration tolerance has been reached, that is when the Actual curve—of the deceleration tolerance intersects with the target curve the molding is finished.

The advantage of the control system is that regardless of the wall thicknesses of the hose, of the pipe, of the plug the program always forms to the desired—dependent on the path/wall thickness, set—molding degree.

Basic Pressure Molding Sequence:

run to minimum molding path check whether Actualforce$<F_{max}$ continue until Endforce has been reached, $F_{soll}$ has to be continuously calculated stop when $F_{soll}=F_{ist}$—Bremstoleranz has been reached check whether we are in the bounds of the concentrated forces continuous monitoring of the stop criteria Definition Molding:

Codes:

$S_{max}$ . . . MaxMoldpath (mm)

$S_{wp}$ . . . PathTurningpoint (mm)

$S_{min}$ . . . MinPath (mm)

$F_{max}$ . . . MaxEndforce (N)

$F_{wp}$ . . . ForceTurningpoint (N)

$F_{min}$ . . . MinEndforce (N)

min./max Einzel-F . . . Concentrated force tolerance (%)

F-Toleranz in % . . . Endforce tolerance (%)

F-Riβ . . . Crackdetection (?)

k1 . . . Gradient 1 k2 . . . Gradient 2

Tk1 . . . Tempfactor k1

Tk2 . . . Tempfactor k2

Tswp . . . TempfactorPathWP v schnell . . . v fast (mm/s)

v langsam . . . v slow (mm/s)

v langsam ab Weg . . . v slow from path (mm)

Vorpreβeinzelkraft . . . Premoldforce (N)

Stillstandszeit . . . Downtime (ms)

FIG. 9 shows the deformation force on the ordinate, while the path of deformation is shown on the abscissa. To be more precise it is a matter of the path which the expanding shoulders 16 of the expanding jaws 9 execute in radial direction.

Proceeding from position 36 the bracing operation begins now and first a quasi-linear deformation takes place on the straight line 37. A molding curve 38 is defined, which represents the connection between molding force and molding degree.

Beginning from a turning point 39 the molding curve can also take on another form. This is shown with molding curve 40.

In the case of position 41 and continuously in the case of the method on the straight line 37 in the direction of the arrow 42 for example with position 41 the target force is determined which is necessary for the molding and which represents the end force. In this connection the maximum force $F_{max}$ should not be exceeded.

Therefore several consecutive positions 41 on the straight line 37 are scanned and an actual-force is always compared to a target-force until the actual-force corresponds to the target-force in position 43, wherein a specific tolerance still has to be taken into account.

In this point (Position 43) the molding is now finished.

The representation in FIG. 9 with straight line 45 shows the total hose wall thickness between a minimum and a maximum value.

For example if the hose wall thickness in the case of a thick hose is defined at position 44 then one recognizes in the diagram that a relatively high molding force is required.

However, if a relatively low hose wall thickness is molded at position 46, then one sees that the molding force is only slight. This results in the intersection point on the straight line 40 (Molding curve).

With this there is the advantage that for the first time now the deformation forces on the expanding jaws 9 can be directly measured and with it a path-dependent power control system for molding is proposed, as a result of which the molding function is optimized and is independent of the wall thickness of the materials, so that the desired molding is always reached.

LEGEND OF THE DRAWINGS

1 Electric motor
2 Spindle
3 Spindle slot
4 Tapered slide valve 4*a*
5 Slot fastening
6 Guide pillar
7 Linear ball type nipple
8 Diagonal slider
9 Expanding jaw
10 Plug
11 Hose
13 Sensor
14 Stop spring
15 Molding slot
16 Expanding shoulder
17 Annular gap (Stecker 10)
18 Sealing washer
19 Tool holding fixture
20 Rotational movement
21 Movement
22 Radial movement
23 Guide (axial and radial)
24 Bracket plate
25 Fastening plate
26 Radial guide
27 Fastening screw
28 Screw coupling
29 Holding fixture (for sealing washer 18)
30 Gap
31 Borehole
32 Fastening point
33 Cross-piece
34 Guide hole
35 Deformation force
36 Position
37 Straight line (Actual-curve)
38 Molding curve
39 Turning point
40 Molding curve
41 Position
42 Direction of the arrow
43 Position
44 Position
45 Straight line
46 Position

The invention claimed is:

1. A method for molding a plug and a hose or a pipe, wherein the plug is part of a pipe connection and the pipe connection is constructed as a sealing plug-in connection between a connecting piece and the plug, which can be locked with the connecting piece, wherein the plug includes an outer part and an inner part connected to each other in one piece and a rear free end of the plug forms an annular gap, the method comprising:

detecting and recording a deformation force acting on each of a plurality of expanding jaws of an expanding device during a step of molding of the plug and the hose or the pipe;

further molding of the plug and the hose or the pipe in dependency on the deformation force recorded in said recording step, as a result of which a constant molding degree is achieved in case of plugs and hoses or pipes with varying wall thicknesses;

monitoring the deformation forces to detect breakage of the expanding device;

monitoring a tightening torque of a plurality of fastening screws of the expanding jaws;

monitoring the deformation forces to detect breakage of the plurality of fastening screws of the expanding jaws;

monitoring the deformation forces to detect variations in the wall thicknesses of the plug and the hose or the pipe;

monitoring the deformation forces to detect cracks in the plug and the hose or the pipe; and minimizing tolerance with regard to concentricity;

whereby the molding steps are performed by a path-dependent power control system.

2. The method according to claim 1, wherein the steps of molding of the plug and the hose or the pipe further comprise the following steps:

positioning a plurality of expanding shoulders of the expanding jaws at a minimum molding path $S_{min}$;

checking whether an actual value $F_{ist}$ of the deformation force is smaller than a maximum value $F_{max}$ of the deformation force;

performing the step of further molding while a target value $F_{soll}$ of the deformation force is continuously calculated and stopping the step of further molding when the actual value $F_{ist}$ of the deformation force is only a specific tolerance value smaller than the target value $F_{soll}$ the deformation force; and checking whether force values are within bounds.

3. The method according to claim 2, wherein the target value $F_{soll}$ of the deformation force depends on an actual executed path $s_{ist}$ of the expanding shoulders of the expanding jaws.

4. The method according to claim 1, wherein said recording and molding steps are performed on three hoses or pipes with different diameters so that the three hoses or pipes are molded to the constant molding degree in order to perform the further steps of obtaining three key parameters, and calculating two gradients using the three key parameters, the gradients indicating molding parameters.

5. The method according to claim 1, wherein the molding steps perform a quasi-linear deformation of the plug and the hose or the pipe.

6. The method according to claim 1, wherein the hose or pipe comprises a relatively thick hose or pipe and the molding steps comprise molding with a relatively high molding force.

* * * * *

UNITED STATES PATENT AND TRADEMARK OFFICE

CERTIFICATE OF CORRECTION

PATENT NO. : 8,752,272 B2
APPLICATION NO. : 12/899669
DATED : June 17, 2014
INVENTOR(S) : Harald Hartmann et al.

It is certified that error appears in the above-identified patent and that said Letters Patent is hereby corrected as shown below:

In the Claims

Claim 2, Column 8, Line 57, before “the deformation force” insert --of--

Signed and Sealed this
Sixteenth Day of September, 2014

Michelle K. Lee

Michelle K. Lee
*Deputy Director of the United States Patent and Trademark Office*